(12) United States Patent
Park

(10) Patent No.: US 7,211,495 B2
(45) Date of Patent: May 1, 2007

(54) SEMICONDUCTOR DEVICES HAVING A CAPACITOR AND METHODS OF MANUFACTURING THE SAME

(75) Inventor: Jeong Ho Park, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/960,216

(22) Filed: Oct. 6, 2004

(65) Prior Publication Data
US 2005/0073053 A1 Apr. 7, 2005

(30) Foreign Application Priority Data
Oct. 6, 2003 (KR) .............. 10-2003-0069172

(51) Int. Cl.
H01L 21/027 (2006.01)
H01L 21/71 (2006.01)
(52) U.S. Cl. .................. 438/386; 438/243
(58) Field of Classification Search ........... 438/381, 438/393, 396, 957, 253, 254, 637, 638, 639, 438/666, 668, 700, 702, 386; 257/532, 535
See application file for complete search history.

(56) References Cited

U.S. PATENT DOCUMENTS 5,468,684 A * 11/1995 Yoshimori et al. ........... 438/3
6,008,083 A * 12/1999 Brabazon et al. ........... 438/239
6,281,541 B1 * 8/2001 Hu .............................. 257/306
6,472,721 B2 * 10/2002 Ma et al. .................... 257/531
6,506,645 B2 * 1/2003 Iyer et al. ................... 438/253
6,680,542 B1 1/2004 Gibson et al. .............. 257/774
6,759,703 B1 * 7/2004 Matsuhashi ................. 257/306
6,767,788 B2 7/2004 Kim ........................... 438/253
6,781,185 B2 * 8/2004 Chen et al. ................. 257/310
6,812,134 B1 * 11/2004 Lu et al. ..................... 438/627
6,856,501 B2 * 2/2005 Matsuhashi .............. 361/321.1
6,921,689 B2 * 7/2005 Matsuhashi ................. 438/240

FOREIGN PATENT DOCUMENTS

KR 10-20000053453 8/2000
KR 10-0424183 3/2004 .................. 27/105

* cited by examiner

Primary Examiner—Douglas W. Owens
Assistant Examiner—Andrew O Arena
(74) Attorney, Agent, or Firm—Andrew D. Fortney

(57) ABSTRACT

Semiconductor devices having a capacitor and methods of manufacturing the same are disclosed. A disclosed semiconductor device includes a semiconductor substrate; a lower interconnection line on the substrate; an upper interconnection line electrically connected to a first portion of the lower interconnection line; a first metal layer electrically connected to a second portion of the lower interconnection line; a capacitor insulating layer on the first metal layer; and a second metal layer on the capacitor insulating layer, wherein the first metal layer, the capacitor insulating layer and the second metal layer form a capacitor 15 Claims, 6 Drawing Sheets

SEMICONDUCTOR DEVICES HAVING A CAPACITOR AND METHODS OF MANUFACTURING THE SAME

FIELD OF THE DISCLOSURE

The present disclosure relates generally to semiconductor devices and, more particularly, to semiconductor devices having a capacitor and methods of manufacturing the same.

BACKGROUND

Generally, semiconductor integrated circuits may be classified as digital or analog depending on the signal processing methods they employ. In digital circuits, input and output signals are binary (e.g., ON or OFF). In analog circuits, input and output signals may vary linearly.

In both digital and analog integrated circuits, information is stored as electronic charges in a capacitor. As a result, the capacitance of the capacitor must be constantly maintained, even in the presence of variations of voltage or temperature, to ensure the integrated circuits exhibit normal driving properties.

Against this background, a metal-insulator-metal (MIM) capacitor has been frequently used to store charges, because it has excellent capacitance properties in the face of variations of voltage and temperature. The MIM capacitor may be simultaneously formed by a dual damascene process when forming interconnection lines, as described in Korean Patent Registration No. 10-0424183, U.S. Pat. 6,767,788, and U.S. Pat. No. 6,680,542.

However, the capacitor insulating layer of the conventional MIM capacitor described in Korean Patent Registration No. 10-0424183 exhibits a high disconnection probability, thereby increasing leakage current. This high disconnection probability is due to the vertical profile of a trench formed by the dual damascene process.

Furthermore, the fabrication process of the conventional MIM capacitor described in Korean Patent Registration No. 10-0424183 is complicated, because an additional pad must be formed in the MIM capacitor for applying a bias to the MIM capacitor.

DETAILED DESCRIPTION

Figure 1A:
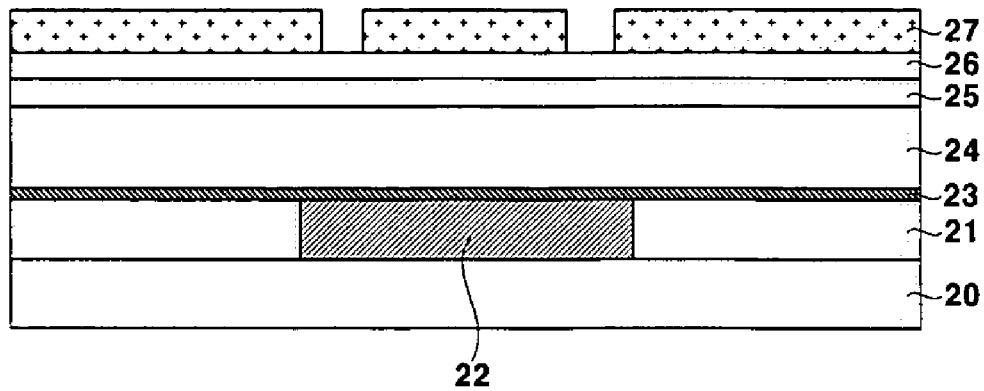
FIGS. 1A–1F are cross-sectional views illustrating an example method of manufacturing a semiconductor device constructed in accordance with the teachings of the present invention.

A first example method of manufacturing a semiconductor device will now be described with reference to FIGS. 1A–1F. As shown in FIG. 1A, a lower insulating layer 21 and a lower interconnection line 22 are formed on a semiconductor substrate 20. A first insulating layer 23, a second insulating layer 24, and a third insulating layer 25 are sequentially formed on the semiconductor substrate 20. A first organic anti-reflective coating (ARC) layer 26 is then formed on the third insulating layer 25. A first photoresist pattern 27 is then formed on the first organic ARC layer 26 by a photolithography process.

Figure 1B:
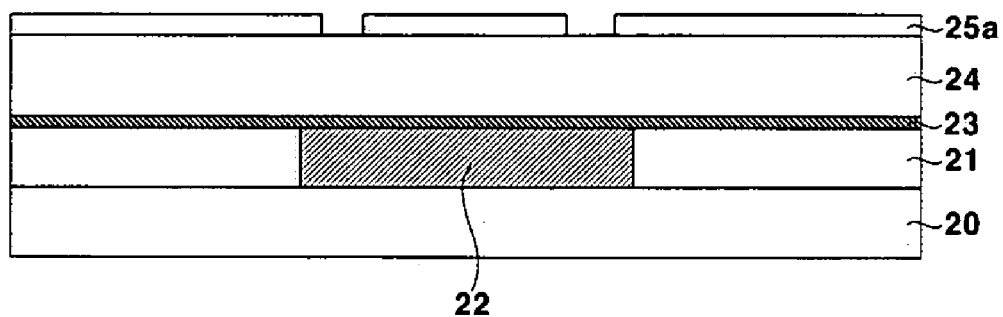

As shown in FIG. 1B, the first organic ARC layer 26 (refer to FIG. 1A) is etched using the first photoresist pattern 27 (refer to FIG. 1A) as an etch mask. The third insulating layer 25 is then etched by a dry etching process using the etched first organic ARC layer 26 and the first photoresist pattern 27 as an etch mask to form an insulating layer pattern 25a. The insulating layer pattern 25a exposes first and second portions of the second insulating layer 24 over first and second portions of the lower interconnection line 22. Thereafter, the first photoresist pattern 27 and the first organic ARC layer 26 are removed by a well-known conventional method.

Figure 1C:
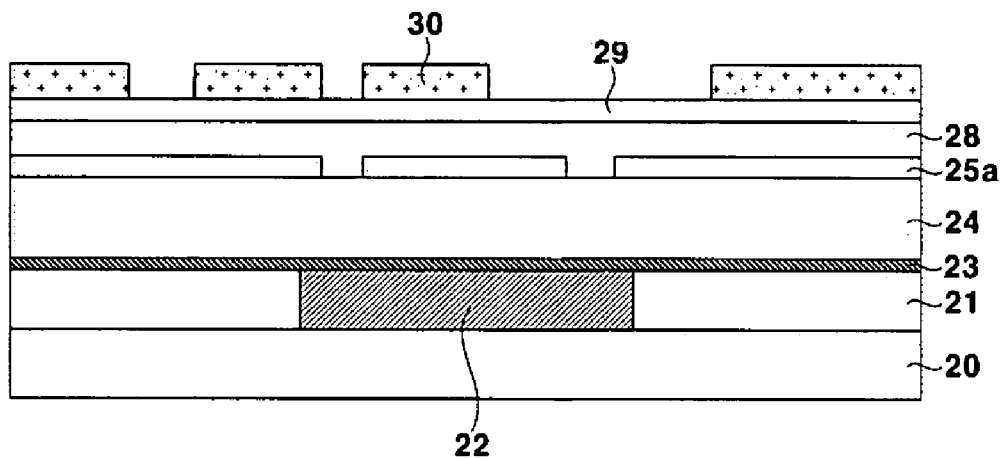

As shown in FIG. 1C, a fourth insulating layer 28 is formed on the entire surface of the structure of FIG. 1B so as to fill the spaces between the insulating layer pattern 25a. A second organic ARC layer 29 is formed on the fourth insulating layer 28. Then, a second photoresist pattern 30 is formed on the second organic ARC layer 29 by a photolithography process.

As shown in FIG. ID, the second organic ARC layer 29 (refer to FIG. 1C) is etched using the second photoresist pattern 30 (refer to FIG. 1C) as an etch mask. Thereafter, the fourth insulating layer 28 is etched by a wet etching process using the etched second organic ARC layer 29 and the second photoresist pattern 30 as an etch mask and using the insulating layer pattern 25a as an etch barrier. As a result, a first trench 31a exposing a portion of the insulating layer pattern 25a and a second trench 31b exposing a portion of the second insulating layer 24 disposed over the first portion of the lower interconnection line 22 are formed at an interconnection line region. Additionally, a third trench 31c exposing a portion of the second insulating layer 24 over the second portion of the lower interconnection line 22 is formed at a capacitor region. In the illustrated example, the first, second and third trenches 31a, 31b and 31c are formed by the wet etching process so that each has a curved profile.

Subsequently, the portions of the second insulating layer 24 and the first insulating layer 23 at the bottom of the second and third trenches 31b and 31c are sequentially etched by a dry etching process to form a first via hole 32a exposing the first portion of the lower interconnection line 22 and a second via hole 32b exposing the second portion of the lower interconnection line 22. In the illustrated example, the first and second via holes 32a and 32b are formed by the dry etching process, so that they each have a vertical profile. Thereafter, the second photoresist pattern 30 and the second organic ARC layer 29 are removed by a well-known conventional method.

Figure 1D:
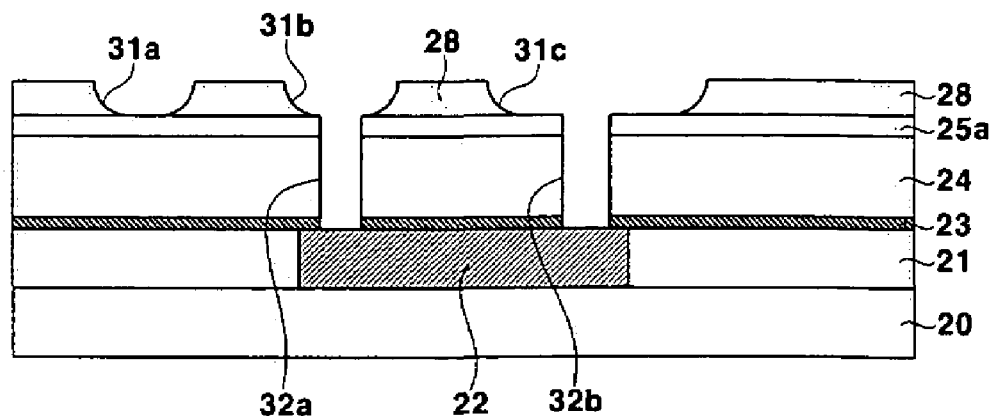
Figure 1E:
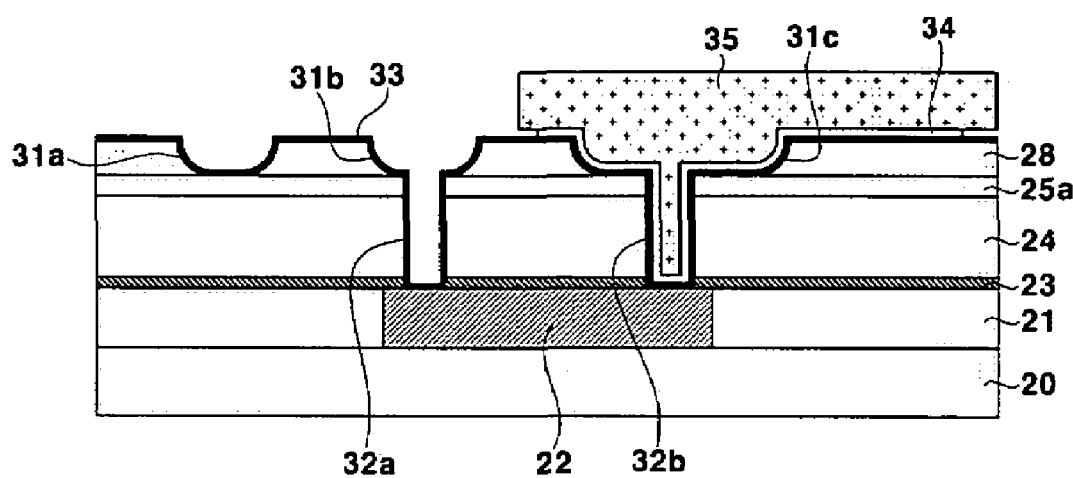

As shown in FIG. 1E, a first metal layer 33 is formed on the entire surface of the structure of FIG. 1D. An insulating material layer for use in a capacitor is then formed on the first metal layer 33. In the illustrated example, as the trenches 31a, 31b and 31c each have a curved profile, the thickness of the insulating material layer is uniformly formed, and, therefore, is capable of improving the leakage current properties. Subsequently, a third photoresist pattern 35 is formed on the insulating material layer by a photolithography process The insulating material layer is then etched by a wet etching process using the third photoresist pattern 35 as an etch mask to form a capacitor insulating layer 34 on the first metal layer 33 of the capacitor region.

Figure 1F:
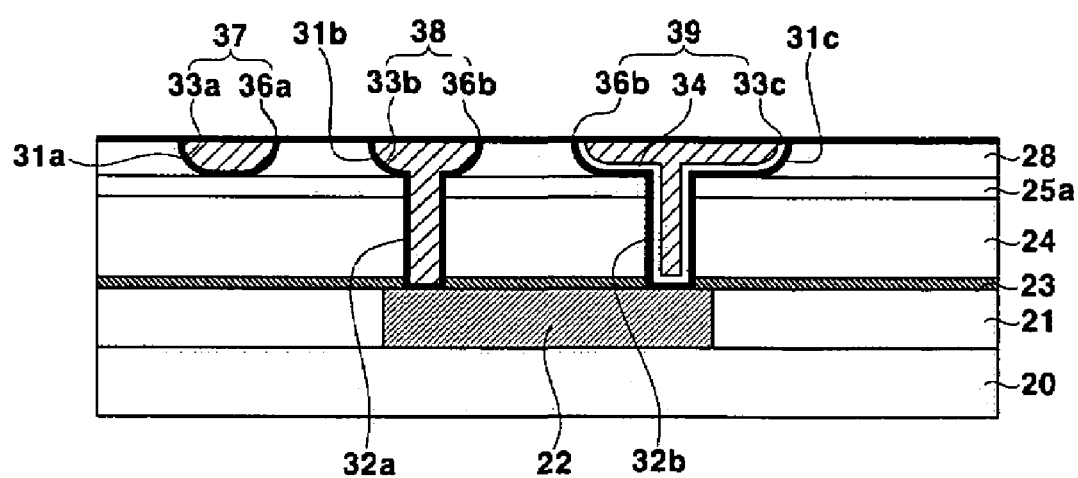

As shown in FIG. 1F, the third photoresist pattern 35 (refer to FIG. 1E) is removed by a well-known conventional method. A second metal layer is formed on the entire surface of the substrate so as to fill the trenches 31a, 31b, and 31c and via holes 32a and 32b. Then, a planarization process is performed by chemical mechanical polishing (CMP) so as to expose the fourth insulating layer 28. As a result, a first upper interconnection line 37 (which is formed of the first and second metal layers 33a and 36a) and a second upper interconnection line 38 (which is formed of the first and second metal layers 33b and 36b and which is electrically connected to the first portion of the lower interconnection line 22) are respectively formed in the interconnection line region, and a MIM capacitor 39 (which is formed of a lower electrode of the first metal layer 33c, the capacitor insulating layer 34, and an upper electrode of the second metal layer 36c, and which is electrically connected to the second portion of the lower interconnection line 22) is formed in the capacitor region.

In the illustrated example, the first upper interconnection line 37 acts as a damascene line. The second upper interconnection line 38 is electrically connected to the lower electrode of the second metal layer 33c of the MIM capacitor 39 through the lower interconnection line 22, so that it acts as a pad to apply a bias to the capacitor 39. As a result, there is no need to form an additional pad for the lower electrode of the capacitor 39. Consequently, the fabrication process of the MIM capacitor of FIGS. 1a–1F is simplified relative to the prior art method mentioned above.

Figure 2A:
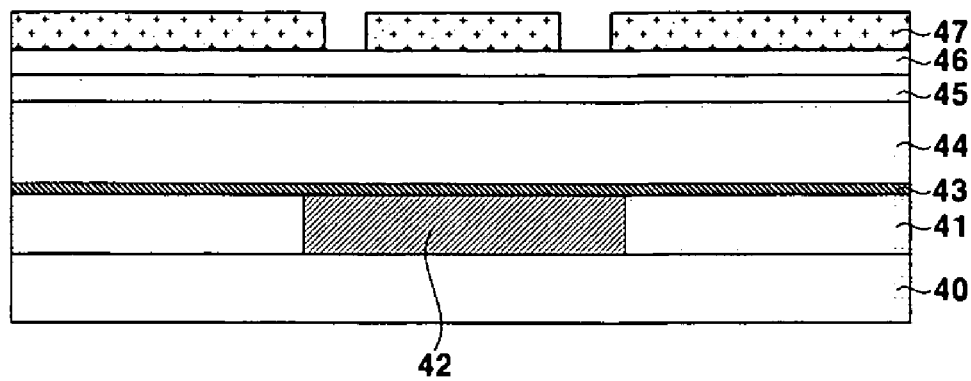
FIGS. 2A–2F are cross-sectional views illustrating another example method of manufacturing a semiconductor device constructed in accordance with the teachings of the present invention.

Next, a second example method of manufacturing a semiconductor device will be described with reference to FIGS. 2A–2F. As shown in FIG. 2A, a lower insulating layer 41 and a lower interconnection line 42 are formed on a semiconductor substrate 40. A first insulating layer 43, a second insulating layer 44, and a third insulating layer 45 are sequentially formed on the semiconductor substrate 40. A first organic anti-reflective coating (ARC) layer 46 is then formed on the third insulating layer 45. A first photoresist pattern 47 is then formed on the first organic ARC layer 46 by a photolithography process.

Figure 2B:
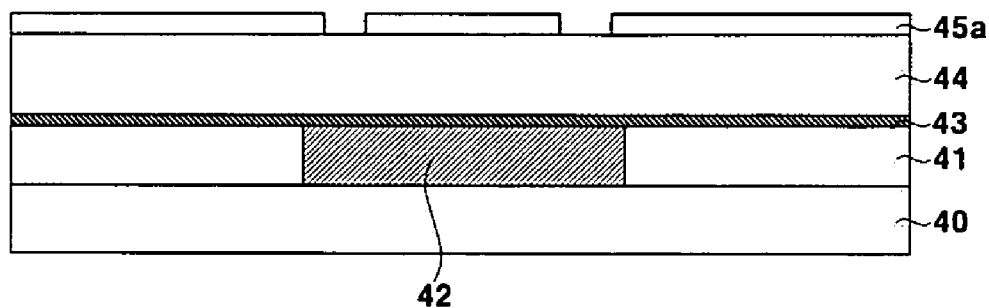

As shown in FIG. 2B, the first organic ARC layer 46 (refer to FIG. 2A) is etched using the first photoresist pattern 47 (refer to FIG. 2A) as an etch mask. The third insulating layer 45 is then etched by a dry etching process using the etched first organic ARC layer 46 and the first photoresist pattern 47 as an etch mask to form an insulating layer pattern 45a. The insulating layer pattern 45a respectively exposes first and second portions of the second insulating layer 44 over first and second portions of the lower interconnection line 42. Subsequently, the first photoresist pattern 47 and the first organic ARC layer 46 are removed by a well-known conventional method.

Figure 2C:
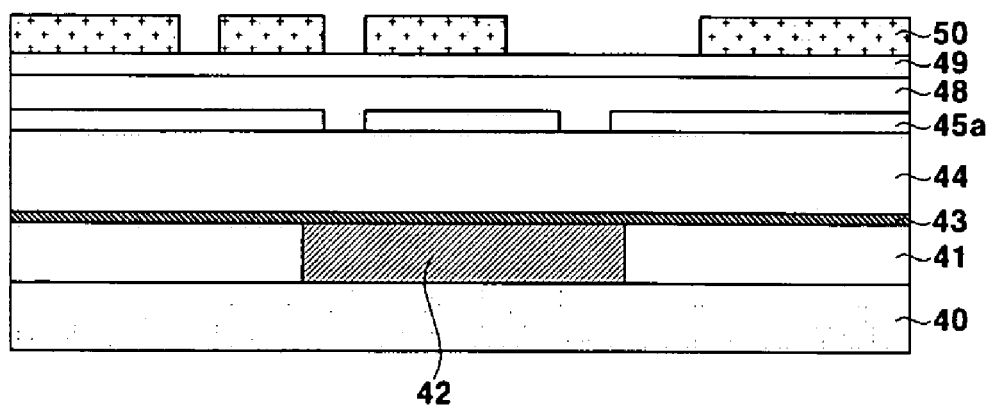

As shown in FIG. 2C, a fourth insulating layer 48 is formed on the entire surface of the structure of FIG. 2B so as to fill the spaces between the insulating layer pattern 45a. A second organic ARC layer 49 is formed on the fourth insulating layer 48. Then, a second photoresist pattern 50 is formed on the second organic ARC layer 49 by a photolithography process.

Figure 2D:
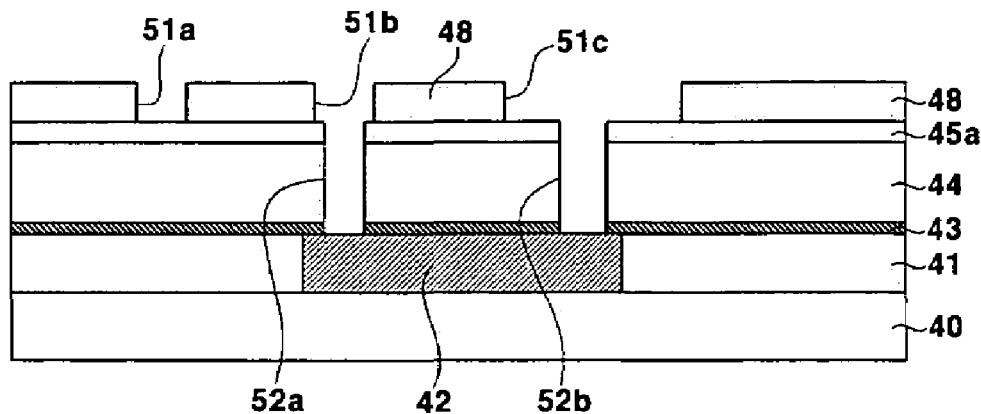

As shown in FIG. 2D, the second organic ARC layer 49 (refer to FIG. 2C) is etched using the second photoresist pattern 50 (refer to FIG. 2C) as an etch mask. Subsequently, the fourth insulating layer 48 is etched by a dry etching process using the etched second organic ARC layer 49 and the second photoresist pattern 50 as an etch mask and using the insulating layer pattern 45a as an etch barrier. As a result, a first trench 51a (which exposes a portion of the insulating layer pattern 45a) and a second trench 51b (which exposes the second insulating layer 44 over the first portion of the lower interconnection line 42) are formed in an interconnection line region, and a third trench 51c (which exposes the second insulating layer 44 over the second portion of the lower interconnection line 42) is formed in a capacitor region. In the illustrated example, the first, second, and third trenches 51a, 51b and 51c are formed by the dry etching process, so that they each have a substantially vertical profile.

Subsequently, portions of the second insulating layer 44 and portions of the first insulating layer 43 at the bottom of the second and third trenches 51b and 51c are sequentially etched by a dry etching process to form a first via hole 52a exposing the first portion of the lower interconnection line 42 and a second via hole 52b exposing the second portion of the lower interconnection line 42. In the illustrated example, the first and second via holes 52a and 52b are formed by the dry etching process, so that they each have a substantially vertical profile like the trenches 51a, 51b, and 51c. Thereafter, the second photoresist pattern 50 and the second organic ARC layer 49 are removed by a well-known conventional method.

Figure 2E:
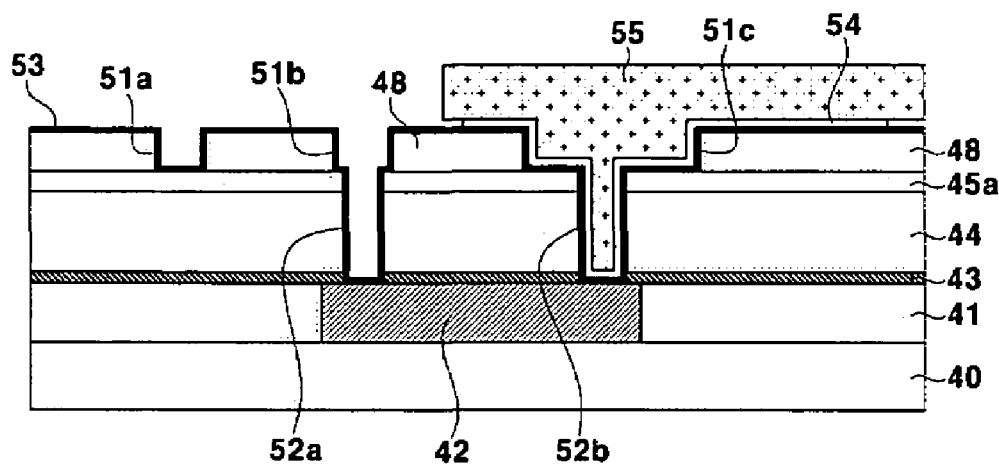

As shown in FIG. 2E, a first metal layer 53 is formed on the entire surface of the structure of FIG. 2D. An insulating material layer for use in a capacitor is then formed on the first metal layer 53. Thereafter, a third photoresist pattern 55 is formed on the insulating material layer by a photolithography process. The insulating material layer is then etched by a wet etching process using the third photoresist pattern 55 as an etch mask to form a capacitor insulating layer 54 on the first metal layer 53 of the capacitor region.

Figure 2F:
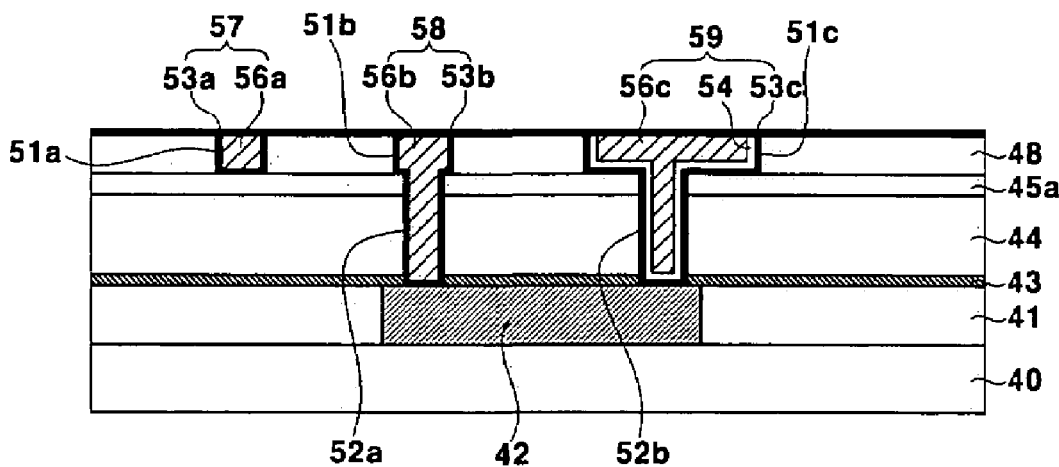

As shown in FIG. 2F, the third photoresist pattern 55 (refer to FIG. 2E) is removed by a well-known conventional method. A second metal layer is formed on the entire surface of the resulting structure so as to fill the trenches 51a, 51b, and 51c and via holes 52a and 52b. Then, a planarization process is performed by CMP so as to expose the fourth insulating layer 48. As a result, a first upper interconnection line 57 (formed of the first and second metal layers 53a and 56a) and a second upper interconnection line 58 (formed of the first and second metal layers 53b and 56b and electrically connected to the first portion of the lower interconnection line 42) are formed in the interconnection line region, and a MIM capacitor 59 (formed of a lower electrode of the first metal layer 53c, the capacitor insulating layer 54 and an upper electrode of the second metal layer 56c, and electrically connected to the second portion of the lower interconnection line 42), is formed in the capacitor region.

In the illustrated example, the first upper interconnection line 57 acts as a damascene line. The second upper interconnection line 58 is electrically connected to the lower electrode of the second metal layer 53c of the MIM capacitor 59 through the lower interconnection line 42, so that it acts as a pad to apply a bias to the capacitor 59. As a result, there is no need to form an additional pad for the lower electrode of the capacitor 59, so that the fabrication process of the MIM capacitor of FIG. 2F is simplified relative to the prior art fabrication process discussed above.

Figure 3A:
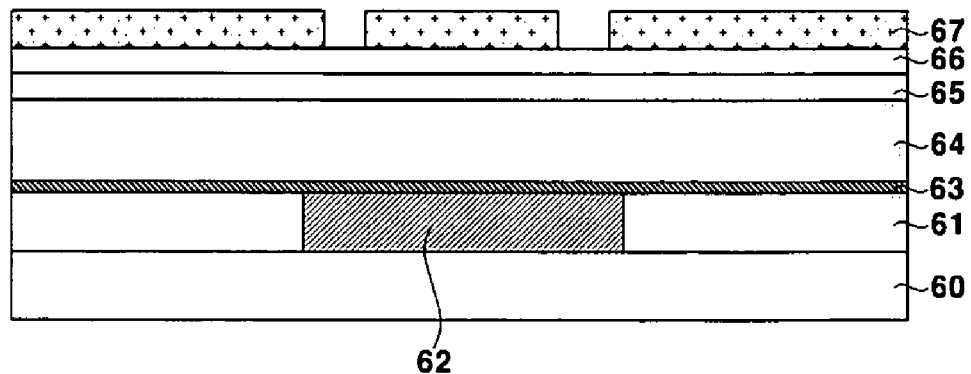
FIGS. 3A–3F are cross-sectional views illustrating still another example method of manufacturing a semiconductor device constructed in accordance with the teachings of the present invention.

Finally, a third example method of manufacturing a semiconductor device will be described with reference to FIGS. 3A–3F. As shown in FIG. 3A, a lower insulating layer 61 and a lower interconnection line 62 are formed on a semiconductor substrate 60. A first insulating layer 63, a second insulating layer 64, and a third insulating layer 65 are sequentially formed on the semiconductor substrate 60. A first organic anti-reflective coating (ARC) layer 66 is then formed on the third insulating layer 65. A first photoresist pattern 67 is then formed on the first organic ARC layer 66 by a photolithography process.

Figure 3B:
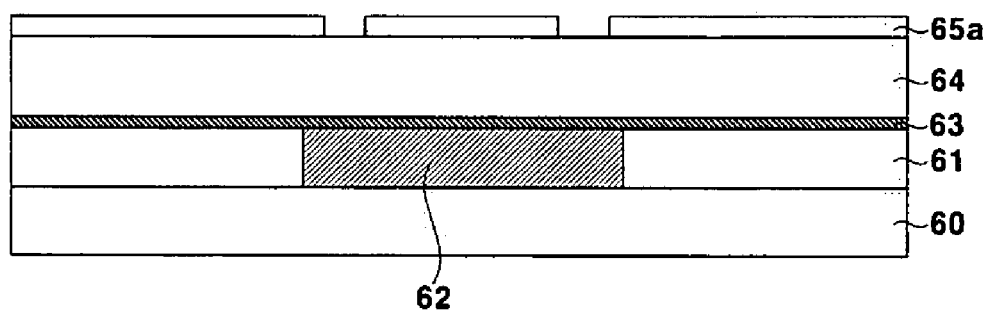

As shown in FIG. 3B, the first organic ARC layer 66 (refer to FIG. 3A) is etched using the first photoresist pattern 67 (refer to FIG. 3A) as an etch mask. The third insulating layer 65 is etched by a dry etching process using the etched first organic ARC layer 66 and the first photoresist pattern 67 as an etch mask, to form an insulating layer pattern 65a respectively exposing the second insulating layer 64 over first and second portions of the lower interconnection line 62. Subsequently, the first photoresist pattern 67 and the first organic ARC layer 66 are removed by a well-known conventional method.

Figure 3C:
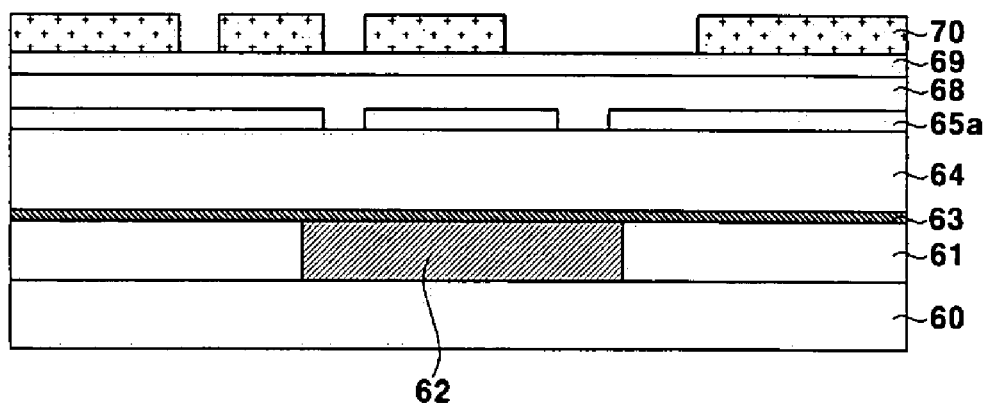

As shown in FIG. 3C, a fourth insulating layer 68 is formed on the entire surface of the structure of FIG. 3B so as to fill the spaces between the insulating layer pattern 65a. A second organic ARC layer 69 is formed on the fourth insulating layer 68. Then, a second photoresist pattern 70 is formed on the second organic ARC layer 69 by a photolithography process.

Figure 3D:
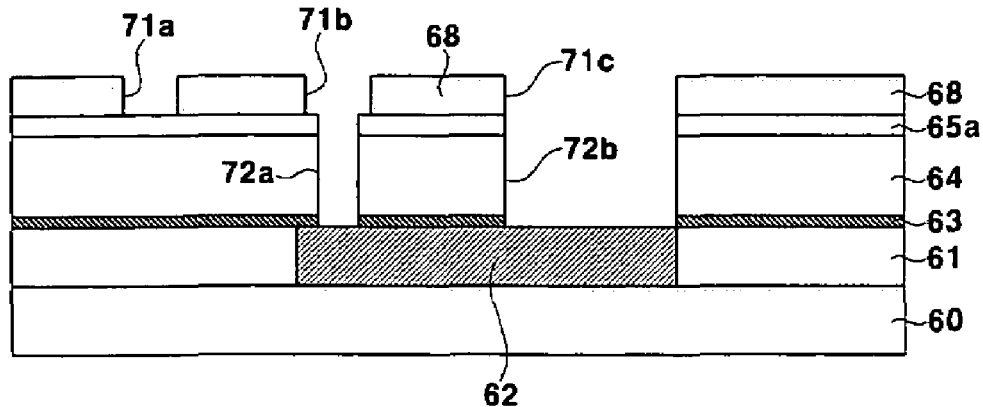

As shown in FIG. 3D, the second organic ARC layer 69 (refer to FIG. 3C) is etched using the second photoresist pattern 70 (refer to FIG. 3C) as an etch mask. Subsequently, the fourth insulating layer 68 is etched by a dry etching process using the etched second organic ARC layer 69 and the second photoresist pattern 70 as an etch mask and using the insulating layer pattern 65a as an etch barrier. As a result, a first trench 71a (which exposes a portion of the insulating layer pattern 65a) and a second trench 71b (which exposes a portion of the second insulating layer 64 over the first portion of the lower interconnection line 62) are formed in an interconnection line region, and a third trench 71c (which exposes the second insulating layer 64 over the second portion of the lower interconnection line 62) is formed in a capacitor region. In the illustrated example, the first, second, and third trenches 71a, 71b, and 71c are formed by the dry etching process, so that they each have a substantially vertical profile.

Subsequently, the portions of the second insulating layer 64 and the portions of the first insulating layer 63 at the bottoms of the second and third trenches 71b and 71c are sequentially etched by a dry etching process to form a first via hole 72a exposing the first portion of the lower interconnection line 62 and a second via hole 72b exposing the second portion of the lower interconnection line 62. Then, the insulating layer pattern 65a, the second insulating layer 64, and the first insulating layer 63 of the side of the second via hole 72b are sequentially etched to widen the width of the second via hole 72b so that the second via hole has the same width as the third trench 71c. In the illustrated example, the first and second via holes 72a and 72b are formed by the dry etching process, so that they each have a substantially vertical profile, the same as the trenches 71a, 71b, and 71c. The second photoresist pattern 70 and the second organic ARC layer 69 are then removed by a well-known conventional method.

Figure 3E:
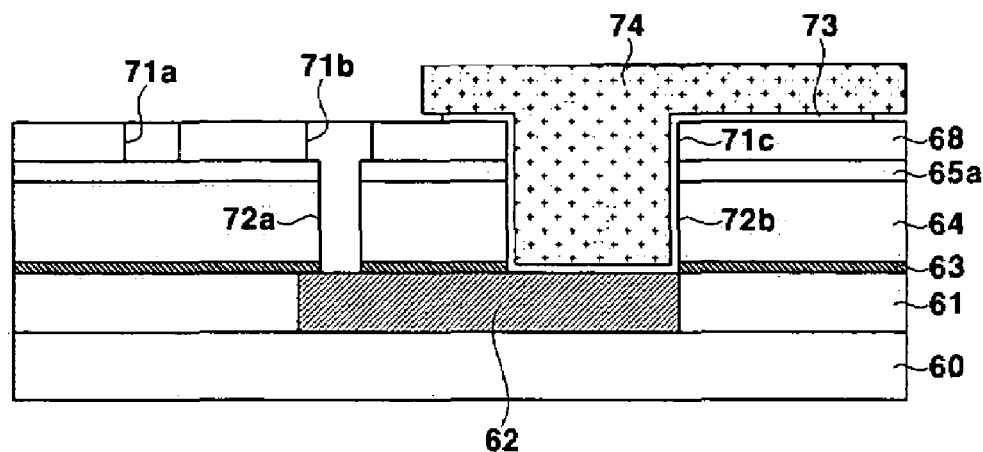

As shown in FIG. 3E, an insulating material layer for use in a capacitor is formed on the entire surface of the structure of FIG. 3D. Subsequently, a third photoresist pattern 74 is formed on the insulating material layer by a photolithography process. The insulating material layer is then etched by a wet etching process using the third photoresist pattern 74 as an etch mask to form a capacitor insulating layer 73 in the capacitor region.

Figure 3F:
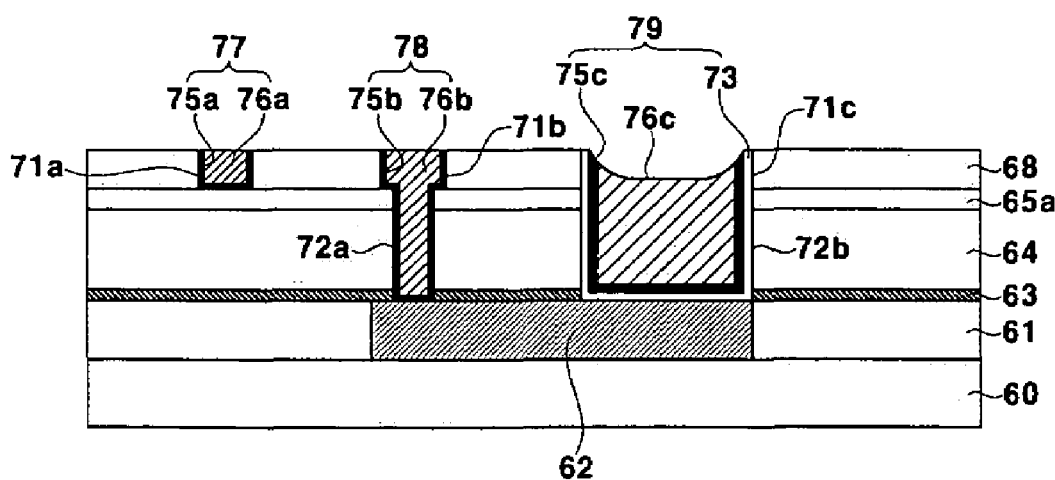

As shown in FIG. 3F, the third photoresist pattern 74 (refer to FIG. 3E) is removed by a well-known conventional method. A barrier metal layer and a metal layer are sequentially formed on the entire surface of the resulting structure so as to fill the trenches 71a, 71b, and 71c and via holes 72a and 72b. Then, a planarization process is performed by CMP so as to expose the fourth insulating layer 68. As a result, a first upper interconnection line 77 (formed of the barrier metal layer 75a and the metal layer 76a) and a second upper interconnection line 78 (formed of the barrier metal layer 75b and the metal layers 76b and electrically connected to the first portion of the lower interconnection line 62) are respectively formed in the interconnection line region, and a MIM capacitor 79 (formed of a lower electrode of the lower interconnection line 62, the capacitor insulating layer 73, and an upper electrode of the barrier metal layer 75c and the metal layer 76c), is formed in the capacitor region.

In the illustrated example, the first upper interconnection line 77 acts as a damascene line. The second upper interconnection line 78 is electrically connected to the lower electrode of the MIM capacitor 79, so that it acts as a pad to apply a bias to the capacitor 79. As a result, there is no need to form an additional pad for the lower electrode of the capacitor 79, so that the fabrication process of the MIM capacitor of FIG. 3F is simplified relative to the prior art process discussed above.

In the example of FIG. 3F, the second via hole 72b of the capacitor region has the same width as the third trench 71c. As a result, the second portion of the lower interconnection line 62 is relatively widely exposed. Consequently, enough capacitance for the MIM capacitor can be obtained even though the lower interconnection line 62 acts as the lower electrode of the capacitor 79. Furthermore, there is no need to form an additional metal layer for use in the lower electrode, so that the fabrication process of the MIM capacitor can be further simplified.

From the foregoing, persons of ordinary skill in the art will appreciate that semiconductor devices with MIM capacitors have been disclosed that have improved leakage current properties and may be fabricated via a simplified fabrication process.

Persons of ordinary skill in the art will further appreciate that a semiconductor device has been disclosed which includes: a semiconductor substrate; a lower interconnection line formed on the substrate; an upper interconnection line formed on a first portion of the lower interconnection line and electrically connected to the lower interconnection line; a first metal layer formed on a second portion of the lower interconnection line and electrically connected to the lower interconnection line; and a capacitor insulating layer and a second metal layer sequentially formed on the first metal layer; wherein the first metal layer, the capacitor insulating layer, and the second metal layer form a capacitor.

Persons of ordinary skill in the art will further appreciate that a semiconductor device has been disclosed which includes: a semiconductor substrate; a lower interconnection line formed on the substrate; an upper interconnection line formed on a first portion of the lower interconnection line and electrically connected to the lower interconnection line; and a capacitor insulating layer and a second metal layer sequentially formed on a second portion of the lower interconnection line; wherein the lower interconnection line, the capacitor insulating layer and the second metal layer form a capacitor.

Persons of ordinary skill in the art will further appreciate that a method of manufacturing a semiconductor device has been disclosed which includes: providing a semiconductor substrate on which a lower interconnection line is formed; sequentially forming first, second, and third insulating layers on the substrate; forming an insulating layer pattern respectively exposing the second insulating layer over first and second portions of the lower interconnection line by etching the third insulating layer; forming a fourth insulating layer on the substrate; etching the fourth insulating layer using the insulating layer pattern as an etch barrier to respectively form a first trench and a second trench; sequentially etching the second and first insulating layers to respectively form a first via hole exposing the first portion of the lower interconnection line and a second via hole exposing the second portion of the lower interconnection line; forming a first metal layer on the substrate; forming a capacitor insulating layer on the first metal layer of the second via hole and the second trench; forming a second metal layer on the substrate; and performing a planarization process so as to expose the fourth insulating layer, to form an upper interconnection line on the first portion of the lower interconnection line and to form a capacitor on the second portion of the lower interconnection line.

In an illustrated example, the first and second trenches have a curved profile, and the etching of the fourth insulating layer is performed by a wet etching process.

Persons of ordinary skill in the art will further appreciate that a method of manufacturing a semiconductor device has been disclosed which includes: providing a semiconductor substrate on which a lower interconnection line is formed; sequentially forming first, second, and third insulating layers on the substrate; forming an insulating layer pattern exposing the second insulating layer over first and second portions of the lower interconnection line by etching the third insulating layer; forming a fourth insulating layer on the substrate; etching the fourth insulating layer using the insulating layer pattern as an etch barrier to form a first trench and a second trench; sequentially etching the second and first insulating layers to respectively form a first via hole exposing the first portion of the lower interconnection line and a second via hole exposing the second portion of the lower interconnection line; forming a capacitor insulating layer on the second via hole and the second trench; forming a metal layer on the substrate; and performing a planarization process so as to expose the fourth insulating layer to form an upper interconnection line on the first portion of the lower interconnection line and to form a capacitor including the lower interconnection line on the second portion of the lower interconnection line.

In an illustrated example, the method of manufacturing the semiconductor device further includes sequentially etching the insulating layer pattern and the second and first insulating layers of sides of the second via hole to widen the width of the second via hole. This widening process may be performed after forming the second via hole and before forming the capacitor insulating layer. In the illustrated example, the widened second via hole has the same width as the second trench.

It is noted that this patent claims priority from Korean Patent Application Serial Number 10-2003-0069172, which was filed on Oct. 6, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of manufacturing a semiconductor device comprising:
sequentially forming first, second, and third insulating layers on a semiconductor substrate having a lower interconnection line thereon;
etching the third insulating layer to form an insulating layer pattern having (i) a first space exposing a first portion of the second insulating layer over a first portion of the lower interconnection line and (ii) a second space exposing a second portion of the second insulating layer over a second portion of the lower interconnection line;
forming a fourth insulating layer on the insulating layer pattern including in the first and second spaces;
etching the fourth insulating layer using the insulating layer pattern as an etch barrier to form a first trench and a second trench;
etching the first and second insulating layers to form a first via hole exposing the first portion of the lower interconnection line and a second via hole exposing the second portion of the lower interconnection line;
forming a first metal layer on an entire surface of the device;
forming a capacitor insulating layer on the first metal layer in the second via hole and the second trench;
forming a second metal layer on an entire surface of the device including in the first and second via holes and first and second trenches; and
planarizing the second metal layer to expose the fourth insulating layer and form an upper interconnection line on the first portion of the lower interconnection line and a capacitor on the second portion of the lower interconnection line.

2. A method as defined in claim 1, wherein the first and second trenches have a curved profile.

3. A method as defined in claim 2, wherein etching the fourth insulating layer comprises a wet etching process.

4. The method of claim 1, wherein etching the insulating layers comprises forming an organic antireflective coating (ARC) layer on the insulating layer prior to forming a photoresist pattern.

5. A method as defined in claim 1, wherein etching the first, second, and third insulating layers comprises a dry etching process.

6. The method as defined in claim 1, wherein etching the capacitor insulating layer comprises a wet etching process.

7. The method of claim 1, wherein the capacitor insulating material layer has a uniform thickness.

8. A method of manufacturing a semiconductor device comprising:
sequentially forming first, second, and third insulating layers on a semiconductor substrate having a lower interconnection line thereon;
etching the third insulating layer to form an insulating layer pattern having (i) a first space exposing a first portion of the second insulating layer over a first portion of the lower interconnection line and (ii) a second space exposing a second portion of the second insulating layer over a second portion of the lower interconnection line;
forming a fourth insulating layer on the insulating layer pattern including in the first and second spaces;
etching the fourth insulating layer using the insulating layer pattern as an etch barrier to form a first trench and a second trench;
etching the first and second insulating layers to form a first via hole exposing the first portion of the lower interconnection line and a second via hole exposing the second portion of the lower interconnection line;

forming a capacitor insulating layer on the second via hole and the second trench;

forming a metal layer on an entire surface of the device, including in the first and second via holes and first and second trenches; and planarizing the second metal layer to expose the fourth insulating layer and form an upper interconnection line on the first portion of the lower interconnection line and a capacitor including the lower interconnection line on the second portion of the lower interconnection line.

9. A method as defined in claim 8, further comprising etching the insulating layer pattern and the first and second insulating layers at sides of the second via hole to widen the second via hole after forming the second via hole and before forming the capacitor insulating layer.

10. A method as defined in claim 9, wherein the second via hole and the second trench have a substantially identical width.

11. A method as defined in claim 8, further comprising forming a barrier metal layer after forming the capacitor insulating layer end before forming the metal layer.

12. The method of claim 8, wherein etching the insulating layer comprises forming an organic antireflective coating (ARC) layer on the insulating layer prior to forming a photoresist pattern.

13. A method as defined in claim 8, wherein etching the first, second, and third insulating layers comprises a dry etching process.

14. The method as defined in claim 8, wherein etching the capacitor insulating layer comprises a wet etching process.

15. The method of claim 8, wherein the capacitor insulating material layer has a uniform thickness.

* * * * *